(12) United States Patent
Heo et al.

(10) Patent No.: US 12,206,009 B2
(45) Date of Patent: *Jan. 21, 2025

(54) ELECTRONIC DEVICES AND METHODS OF MANUFACTURING THE SAME

(71) Applicant: Samsung Electronics Co., Ltd., Suwon-si (KR)

(72) Inventors: Jinseong Heo, Seoul (KR); Yunseong Lee, Osan-si (KR); Taehwan Moon, Suwon-si (KR); Sanghyun Jo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/513,042

(22) Filed: Nov. 17, 2023

(65) Prior Publication Data
US 2024/0088256 A1   Mar. 14, 2024

Related U.S. Application Data

(63) Continuation of application No. 17/208,018, filed on Mar. 22, 2021, now Pat. No. 11,862,705.

(30) Foreign Application Priority Data

Mar. 24, 2020   (KR) .................. 10-2020-0035808

(51) Int. Cl.
*H01L 29/51* (2006.01)
*H01L 21/28* (2006.01)
(Continued)

(52) U.S. Cl.
CPC ...... *H01L 29/516* (2013.01); *H01L 21/28158* (2013.01); *H01L 29/40111* (2019.08); *H10B 51/00* (2023.02); *H10B 51/30* (2023.02)

(58) Field of Classification Search
CPC ........ H10B 51/00; H10B 51/30; H10B 53/00; H10B 53/30; H01L 29/516; H01L 29/40111; H01L 21/28158
See application file for complete search history.

(56) References Cited

U.S. PATENT DOCUMENTS 9,608,101 B2   3/2017   Kis et al.
10,211,312 B2   2/2019   Van Houdt et al.
(Continued)

FOREIGN PATENT DOCUMENTS

KR   10-2021-0081180 A   7/2021
WO   WO-2016-031968 A1   3/2016

OTHER PUBLICATIONS

Kanghoon Yim, et al., "Novel high-k dielectrics for next-generation electronic devices screened by automated ab initio calculations", NPG Asia Materials, 2015, doi:10.1038/am2015.57.
(Continued)

*Primary Examiner* — Jose R Diaz
(74) *Attorney, Agent, or Firm* — Harness, Dickey & Pierce, P.L.C.

(57) ABSTRACT

An electronic device includes a seed layer including a two-dimensional (2D) material, and a ferroelectric layer on the seed layer. The ferroelectric layer is configured to be aligned in a direction in which a (111) crystal direction is perpendicular to a top surface of a substrate on which the seed layer is located and/or a top surface of the seed layer.

19 Claims, 12 Drawing Sheets

(51) Int. Cl.
  H10B 51/00    (2023.01)
  H10B 51/30    (2023.01)

(56)                References Cited

U.S. PATENT DOCUMENTS 10,256,164 B2    4/2019   Takeya et al.
    11,145,731 B2   10/2021   Moon et al.
    11,588,034 B2    2/2023   Lee et al.
    11,862,705 B2 *  1/2024   Heo ................. H01L 21/28158
  2021/0193811 A1    6/2021   Moon et al.

OTHER PUBLICATIONS

Takahisa Shiraishi et al., "Impact of mechanical stress on ferroelectricity in (Hf0.5Zr0.5) O2 thin films", Appl. Phys. Lett., vol. 108, No. 262904, (2016), https://doi.org/10.1063/1.4954942.

Takao Shimizu et al., "The demonstration of significant ferroelectricity in epitaxial Y-doped Hf02 film", Scientific Reports, vol. 6, No. 32931, (2016), DOI: 10.1038/srep32931.

Yingfen Wei, et al., "A rhombohedral ferroelectric phase in epitaxially strained $Hf_{0.5}Zr_{0.5}O_2$ thin films", Nature Materials, vol. 17, Dec. 2018, pp. 1095-1100, https://doi.org/10.1038/s41563-018-0196-0.

Herng Yau Yoong et al., "Epitaxial Ferroelectric $Hf_{0.5}Zr_{0.5}O_2$ Thin Films and Their Implementations in Memristors for Brain-Inspired Computing", Advanced Functional Materials, vol. 28, No. 1806037, pp. 1-10, (2018), DOI: 10,1002/adfm.201806037.

* cited by examiner

ELECTRONIC DEVICES AND METHODS OF MANUFACTURING THE SAME

CROSS-REFERENCE TO RELATED APPLICATIONS

This application is a continuation of U.S. application Ser. No. 17/208,018, filed Mar. 22, 2021 which claims the benefit, under 35 U.S.C. § 119, of Korean Patent Application No. 10-2020-0035808, filed on Mar. 24, 2020, in the Korean Intellectual Property Office, the disclosure of each of which is incorporated herein in its entirety by reference.

BACKGROUND

1. Field

The present disclosure relates to electronic devices with a decreased operating voltage and methods of manufacturing the same.

2. Description of the Related Art

Existing silicon-based electronic devices have limitations in satisfying both improvements in operation characteristics and scaling down. For example, when measuring an operating voltage and current characteristics of a silicon-based logic transistor, it is known that a subthreshold swing (SS) is limited to about 60 mV/dec. As the size of the logic transistor decreases, it may be difficult to decrease the operating voltage to about 0.8 V or less, and accordingly, power density increases, thereby limiting the scaling down of the logic transistor.

SUMMARY

Provided are electronic devices that may have a decreased operating voltage.

Provided are methods of manufacturing electronic devices that may have a decreased operating voltage.

Additional aspects will be set forth in part in the description which follows and, in part, will be apparent from the description, or may be learned by practice of some example embodiments of the disclosure.

According to some example embodiments, an electronic device may include a substrate, a seed layer on the substrate, and a ferroelectric layer on the seed layer. The seed layer may include a two-dimensional (2D) material. The ferroelectric layer may be configured to be aligned within a range of ±30 degrees with respect to a direction in which a (111) crystal direction is perpendicular to a top surface of the substrate.

The seed layer may have a lattice constant having a magnitude that is in a range of about 90% to about 110% with respect to a magnitude of a lattice constant of the ferroelectric layer.

The seed layer may include a metallic 2D material.

The seed layer may include at least one of 1T-MoTe$_2$, 1T-WTe$_2$, 2H—MoTe$_2$, 2H—WTe$_2$, 1T-ZrS$_2$, 1T-HfS$_2$, 2H—ZrS$_2$, 2H—HfS$_2$, 2H—CrTe$_2$, 2H—HfSe$_2$, 1T-PdS$_2$, 1T-PtS$_2$, 2H—SnS$_2$, 2H—TiSe$_2$, 2H—VTe$_2$, 2H—NbSe$_2$, or GaS.

The seed layer may have a thickness in a range of about 0.3 nm to about 100 nm.

The ferroelectric layer may include hafnium oxide (HfO) or zirconium oxide (ZrO).

The ferroelectric layer may include at least one of hafnium (Hf), silicon (Si), aluminum (Al), zirconium (Zr), yttrium (Y), lanthanum (La), gadolinium (Gd), or strontium (Sr).

The ferroelectric layer may have ferroelectric or anti-ferroelectric properties.

The seed layer may have a hexagonal lattice structure.

The electronic device may further include an upper layer on the ferroelectric layer, the upper layer including at least one of a dielectric, silicon oxide (SiO), aluminum oxide (AlO), hafnium oxide (HfO), zirconium oxide (ZrO), yttrium oxide (YO), lanthanum oxide (LaO), or strontium oxide (SrO).

The upper layer may include at least one of Hf, Si, Al, Zr, Y, La, Gd, or Sr.

The upper layer may include a metal, a metal nitride, or a metal oxide.

The upper layer may include at least one of Si, germanium (Ge), a thin film semiconductor, an oxide semiconductor, a III-V-group compound, a 2D material, transition metal dichalcogenides, a quantum dot, a colloidal QD, a nanocrystal, or an organic material.

The seed layer may have a lattice constant in a range of about 2.16 to about 3.96.

The seed layer may have an energy band gap greater than or equal to about 0.2 and less than or equal to about 1.8.

According to some example embodiments, a method of manufacturing an electronic device may include forming a seed layer on a substrate, wherein the seed layer includes a two-dimensional (2D) material. The method may include forming a ferroelectric layer on the seed layer, wherein the ferroelectric layer is aligned within a range of ±30 degrees with respect to a direction in which a (111) crystal direction of the ferroelectric layer is perpendicular to a top surface of the substrate.

The method may further include crystallizing the ferroelectric layer through an annealing process.

The seed layer may have a lattice constant in a range of about 90% to about 110% with respect to a lattice constant of the ferroelectric layer.

The seed layer may include at least one of 1T-MoTe$_2$, 1T-WTe$_2$, 2H—MoTe$_2$, 2H—WTe$_2$, 1T-ZrS$_2$, 1T-HfS$_2$, 2H—ZrS$_2$, 2H—HfS$_2$, 2H—CrTe$_2$, 2H—HfSe$_2$, 1T-PdS$_2$, 1T-PtS$_2$, 2H—SnS$_2$, 2H—TiSe$_2$, 2H—VTe$_2$, 2H—NbSe$_2$, or GaS.

The ferroelectric layer may include hafnium oxide (HfO) or zirconium oxide (ZrO).

According to some example embodiments, a method of manufacturing a computing device may include manufacturing an electronic device, and forming the computing device based on incorporating the electronic device into a computing device component.

The computing device component may include at least one of a processing circuitry or a memory.

According to some example embodiments, an electronic device may include a seed layer including a two-dimensional (2D) material, and a ferroelectric layer on the seed layer. The ferroelectric layer may be configured to be aligned within a range of ±30 degrees with respect to a direction in which a (111) crystal direction is perpendicular to a top surface of the seed layer.

The electronic device may further include a substrate, wherein the seed layer is on the substrate.

The seed layer may have a lattice constant having a magnitude that is in a range of about 90% to about 110% with respect to a magnitude of a lattice constant of the ferroelectric layer.

The ferroelectric layer may have ferroelectric or antiferroelectric properties.

The seed layer may have a hexagonal lattice structure.

The electronic device may further include an upper layer on the ferroelectric layer. The upper layer may include at least one of a dielectric, silicon oxide (SiO), aluminum oxide (AlO), hafnium oxide (HfO), zirconium oxide (ZrO), yttrium oxide (YO), lanthanum oxide (LaO), or strontium oxide (SrO).

The seed layer may have a lattice constant in a range of about 2.16 to about 3.96.

The seed layer may have an energy band gap greater than or equal to about 0.2 and less than or equal to about 1.8.

According to some example embodiments, a system for manufacturing an electronic device may include a process chamber including a pedestal or chuck configured to structurally support one or more devices or layers in the process chamber. The system may include a plurality of composition sources and a plurality of control devices, each composition source coupled to the process chamber via a separate control device, each control device configured to control a supply of a separate material held in a separate coupled composition source to the process chamber. The system may include processing circuitry configured to control at least the plurality of control devices to manufacture the electronic device based on forming a seed layer on a substrate, wherein the seed layer includes a two-dimensional (2D) material, and forming a ferroelectric layer on the seed layer, wherein the ferroelectric layer is aligned within a range of ±30 degrees with respect to a direction in which a (111) crystal direction of the ferroelectric layer is perpendicular to a top surface of the substrate.

The processing circuitry may be further configured to control at least the plurality of control devices to crystallize the ferroelectric layer through an annealing process, based on causing a heat source to generate heat in the process chamber.

The processing circuitry may be further configured to control at least the plurality of control devices to form an upper layer on the ferroelectric layer. The upper layer may include at least one of a dielectric, silicon oxide (SiO), aluminum oxide (AlO), hafnium oxide (HfO), zirconium oxide (ZrO), yttrium oxide (YO), lanthanum oxide (LaO), or strontium oxide (SrO).

The processing circuitry is further configured to control at least the plurality of control devices to detach the substrate from at least the ferroelectric layer.

BRIEF DESCRIPTION OF THE DRAWINGS

The above and other aspects, features, and advantages of some example embodiments of the disclosure will be more apparent from the following description taken in conjunction with the accompanying drawings, in which.

DETAILED DESCRIPTION

Figure 1:
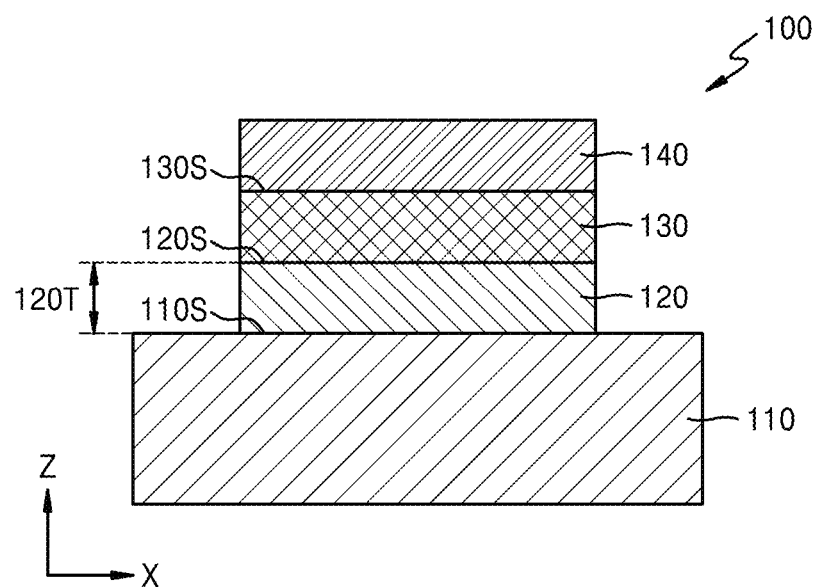
FIG. 1 is a view schematically illustrating an electronic device according to some example embodiments.

Reference will now be made in detail to example embodiments, some of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items (e.g., A, B, and C). Expressions such as "at least one of," when preceding a list of elements, modify the entire list of elements and do not modify the individual elements of the list. For example, "at least one of A, B, and C," and "at least one of A, B, or C" may be construed as covering any one of the following combinations: A; B; A and B; A and C; B and C; and A, B, and C."

Hereinafter, an electronic device and a method of manufacturing the same according to various embodiments will be described in detail with reference to the accompanying drawings. Like reference numerals in the following drawings represent like elements, and the size of each of components in the drawings may be exaggerated for clarity and convenience of explanation. It will be understood that although the terms "first," "second," etc. may be used herein to describe various components, these components should not be limited by these terms. The terms are used only to distinguish one component from other components.

As used herein, the singular forms "a," "an," and "the" are intended to include the plural forms as well, unless the context clearly indicates otherwise. It will also be understood that, when a portion "comprises" a component, this means that a portion may further comprise other components instead of excluding other components, unless specifically stated to the contrary. In addition, the size or thickness of each of components in the drawings may be exaggerated for clarity of explanation.

In addition, when it is described that a particular (or, alternatively, predetermined) material layer is present on a substrate or another layer, the material layer may be in direct contact with the substrate or another layer, or another third layer may be present therebetween. Restated, when an element or layer is referred to as being "on" or "above" another element or layer, the element or layer may be directly on the other element or layer (e.g., in direct contact therewith), or the element or layer may be indirectly on the other element or layer (e.g., isolated from direct contact with the other element or layer by one or more interposing spaces and/or structures). Where an element is described as being directly between two other elements, the element may be in direct contact with each of the two other elements, for example opposite sides or surfaces of the element may each be in direct contact with a separate element of the two other elements. In some example embodiments described herein, a described material for forming each layer is just an example, and other materials than the described material may be used.

In addition, the terms " . . . portion," "module", etc. described in the present specification mean a unit for processing at least one function or operation, and this unit may be implemented with hardware or software or a combination of hardware and software.

Specific implementations described in some example embodiments are examples and do not limit the technical scope in any way. For brevity of the specification, descriptions of electronic configurations according to the related art, control system, software, and other functional aspects of the systems may be omitted. In addition, connections of lines between components shown in the drawings or connection members for the components are illustrative examples of functional connections and/or physical or circuit connections and in a real device, may be represented as alternative or additional various functional connections, physical connections, or circuit connections.

The use of the term "above" and similar indication terms may be applied to both singular and plural.

The steps that make up the method can be done in a suitable order, unless there is a clear statement that they should be done in the order described. In addition, the use of all example terms (e.g., etc.) is merely for describing the technical idea in detail, and the scope of rights is not limited by these terms unless it is limited by the claims.

It will be understood that elements and/or properties thereof may be recited herein as being "the same," "similar to," or "equal" as other elements, and it will be further understood that elements and/or properties thereof recited herein as being "the same" as, "similar" to, or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof (e.g., structures, properties of one or more elements, lengths, distances, energy levels, energy barriers, or the like) described herein as being the "substantially" the same or "similar" thereto encompasses elements and/or properties thereof (e.g., structures, properties of one or more elements, lengths, distances, energy levels, energy barriers, or the like) that are the same within manufacturing tolerances and/or material tolerances and/or elements and/or properties thereof (e.g., structures, properties of one or more elements, lengths, distances, energy levels, energy barriers, or the like) that have a relative difference in magnitude that is equal to or less than 10%. Further, regardless of whether elements and/or properties thereof (e.g., structures, properties of one or more elements, lengths, distances, energy levels, energy barriers, or the like) are modified as "substantially," it will be understood that these elements and/or properties thereof (e.g., structures, properties of one or more elements, lengths, distances, energy levels, energy barriers, or the like) should be construed as including a manufacturing or operational tolerance (e.g., ±10%) around the stated elements and/or properties thereof (e.g., structures, properties of one or more elements, lengths, distances, energy levels, energy barriers, or the like).

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Where elements, properties, or the like are described herein to have a "small" or "very small" difference between each other, it will be understood that a variation between the magnitudes of said elements and/or properties may be equal to or less than 10% of the magnitudes of the elements, properties, or the like being described.

Throughout the specification, it will be understood that, although the terms first, second, etc. may be used herein to describe various elements, these elements, should not be limited by these terms. These terms are only used to distinguish one element from another element.

It will be understood that, where an element, layer, structure, or the like is described herein to be "made of" and/or "formed of" one or more materials, the element, layer, structure, or the like may "at least partially comprise" said one or more materials.

FIG. 1 illustrates an electronic device according to some example embodiments.

An electronic device 100 may include a substrate 110, a seed layer 120 on the substrate 110 (e.g., directly on the substrate 110 so as to be in direct contact with the top surface 110S of the substrate 110), and a ferroelectric layer 130 on the seed layer 120 (e.g., directly on the seed layer 120 so as to be in direct contact with the top surface 120S of the seed layer 120). In some example embodiments, the substrate 110 may be omitted and/or the seed layer 120 may serve as a substrate on which the ferroelectric layer 130 is formed.

It will be understood that in some example embodiments, the adjacent layers 120-140 (e.g., layers 120 and 110, layers 130 and 120, and layers 140 and 130) may not be directly on each other, such that the layers are isolated from direct contact with each other by one or more interposing spaces and/or structures. For example, seed layer 120 may be indirectly on the substrate 110, the ferroelectric layer 130 may be indirectly on the seed layer 120 and between the upper layer 140 and the seed layer 120, and the upper layer 140 may be indirectly on the ferroelectric layer 130.

The substrate 110 may include silicon (Si), germanium (Ge), silicon germanium (SiGe), a III-V-group compound semiconductor, or a two-dimensional (2D) material. However, a material for forming the substrate 110 is not limited by the above description and may be variously changed. For example, the substrate 110 may include Si, Ge, SiGe, Group III-V semiconductors, oxide semiconductors, nitride semiconductors, oxynitride semiconductors, two-dimensional (2D) semiconductor materials, quantum dots, or organic semiconductors, any combination thereof, and or the like.

The seed layer 120 may include a two-dimensional (2D) material, for example. The seed layer 120 may have a lattice structure similar to (e.g., the same or substantially the same as) that of the ferroelectric layer 130.

Figure 2:
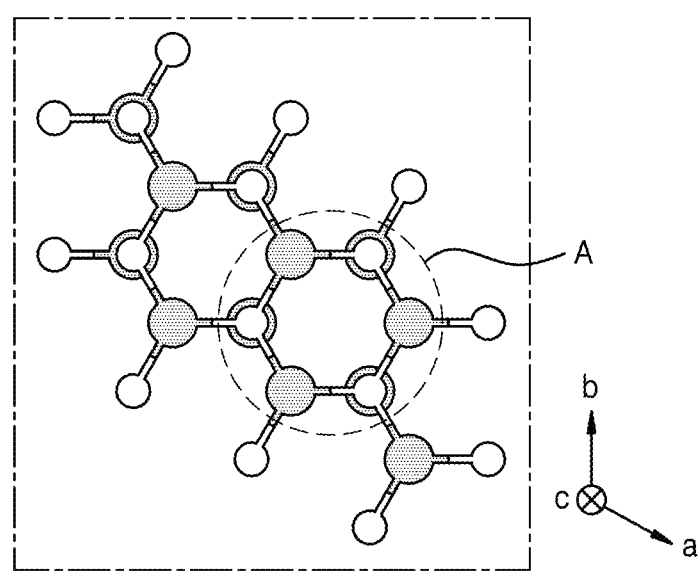
FIGS. 2 and 3 illustrate a crystal structure of a seed layer of an electronic device according to some example embodiments.
Figure 3:
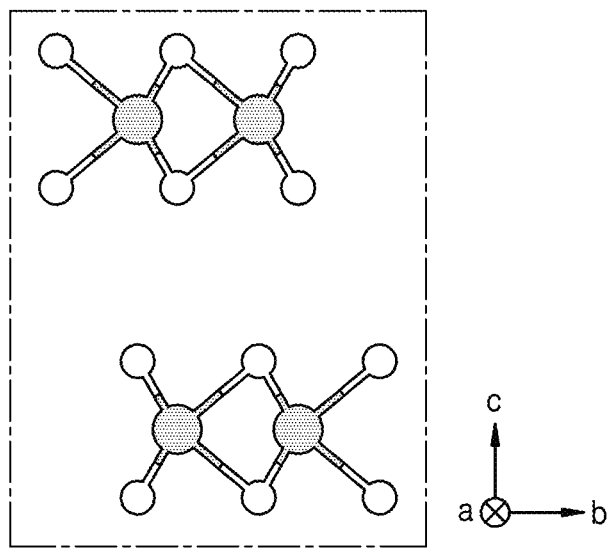

FIG. 2 is a plan view of the lattice structure of the seed layer 120, and FIG. 3 is a front view of the lattice structure of the seed layer 120. The seed layer 120 may have a hexagonal lattice structure, as shown in region A, for example. As shown in region A of FIG. 2, separate elements of the hexagonal lattice structure of the seed layer 120 may be spaced apart by a distance d1.

The seed layer 120 may include, for example, at least one of 1T-$MoTe_2$, 1T-$WTe_2$, 2H—$MoTe_2$, 2H—$WTe_2$, 1T-$ZrS_2$, 1T-$HfS_2$, 2H—$ZrS_2$, 2H—$HfS_2$, 2H—$CrTe_2$, 2H—$HfSe_2$, 1T-$PdS_2$, 1T-$PtS_2$, 2H—$SnS_2$, 2H—$TiSe_2$, 2H—$VTe_2$, 2H—$NbSe_2$, or GaS. In some example embodiments, the seed layer 120 may include a metallic 2D material. The seed layer 120 may have a structure of a 2D material made of Van der Waals bonds.

The seed layer 120 may have the thickness 120T (e.g., in the Z-direction) of about 0.3 nm to about 100 nm, for example. The seed layer 120 may include a thin film, which may contribute to miniaturization of the size of the electronic device 100.

The ferroelectric layer 130 may include a material having a fluorite structure. The ferroelectric layer 130 may have a greater dielectric constant than about 20, for example. However, example embodiments of the present disclosure are not limited thereto. For example, the ferroelectric layer 130 may include an oxide of at least one of Si, aluminum (Al), hafnium (Hf), or zirconium (Zr). For example, the ferroelectric layer 130 may include at least one of a Hf-based oxide or a Zr-based oxide. Here, the Hf-based oxide may include hafnium oxide (HfO) or hafnium zirconium oxide (HfZrO), for example, and the Zr-based oxide may include zirconium oxide (ZrO), for example.

In addition, the ferroelectric layer 130 may further include a dopant. The dopant may include, for example, at least one of Hf, Si, Al, Zr, yttrium (Y), lanthanum (La), gadolinium (Gd), or strontium (Sr). Accordingly, the ferroelectric layer 130 may include at least one of hafnium (Hf), silicon (Si), aluminum (Al), zirconium (Zr), yttrium (Y), lanthanum (La), gadolinium (Gd), or strontium (Sr).

Figure 4:
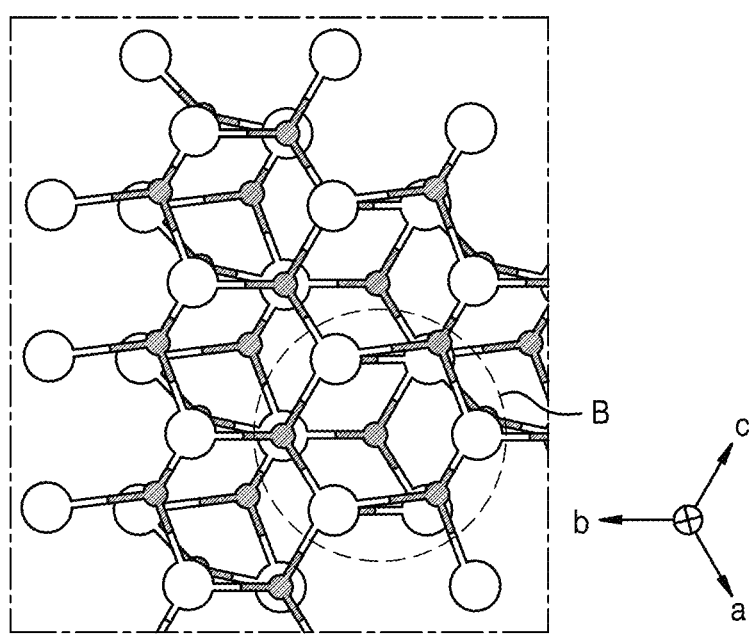
FIG. 4 illustrates a crystal structure of a ferroelectric layer of an electronic device according to some example embodiments.

FIG. 4 is a plan view of the lattice structure of the ferroelectric layer 130. The ferroelectric layer 130 may have a hexagonal lattice structure, as shown in region B of FIG. 4. In this way, the seed layer 120 and the ferroelectric layer 130 may have similar lattice structure (e.g., a substantially same lattice structure). As shown in region B of FIG. 4, separate elements of the hexagonal lattice structure of the ferroelectric layer 130 may be spaced apart by a distance d2.

For example, the ferroelectric layer 130 may be configured to be aligned within a range of equal to or less than ±30 degrees with respect to a direction in which a (111) crystal direction is perpendicular to the top surface 110S of the substrate 110. In another example, including example embodiments where the substrate 110 is absent from the electronic device 100, the ferroelectric layer 130 may be configured to be aligned within a range of equal to or less than ±30 degrees with respect to a direction in which a (111) crystal direction is perpendicular to the top surface 120S of the seed layer 120. In some example embodiments, the ferroelectric layer 130 may be arranged with ±20 degrees with respect to a direction in which the (111) crystal direction is perpendicular to the substrate 110 and/or the top surface 120S of the seed layer 120.

Because the ferroelectric layer 130 may have a lattice structure similar to that of the seed layer 120, when the ferroelectric layer 130 is deposited on the seed layer 120, the ferroelectric layer 130 may be arranged in such a way that the (111) crystal direction of the ferroelectric layer 130 may be perpendicular to the substrate 110 (e.g., perpendicular to the top surface 110S of the substrate 110, for example in the Z-direction that extends perpendicular to the top surface 110S).

The ferroelectric layer 130 may have ferroelectric or anti-ferroelectric properties (e.g., may include a ferroelectric material or an anti-ferroelectric material).

The seed layer 120 may have a lattice constant having a magnitude that is in the range of about 90% to about 110% with respect to the magnitude of the lattice constant of the ferroelectric layer 130. The seed layer 120 may have a lattice constant in the range from about 2.16 to about 3.96, for example. The seed layer 120 may have a lattice constant in the range from about 3.16 to about 3.8, for example. The ferroelectric layer 130 may have a lattice constant having a magnitude that is in the range of about 90% to about 110% with respect to the magnitude of the lattice constant of the seed layer 120. When the lattice constants of the seed layer 120 and the ferroelectric layer 130 are similar to each other, the crystal direction of the ferroelectric layer 130 may be adjusted to correspond to (e.g., to match) the crystal direction of the seed layer 120.

The seed layer 120 may include, for example, a material with an energy band gap of about 2 or less. The seed layer 120 may include, for example, a material with an energy band gap that is greater than or equal to about 0.2 and less than or equal to about 1.8.

An upper layer 140 may be further provided on the ferroelectric layer 130 (e.g., directly on the ferroelectric layer 130 so as to be in direct contact with the top surface 130S of the ferroelectric layer 130). The upper layer 140 may be, for example, a protective layer, an electrode layer, or a metal layer.

The upper layer 140 may include, for example, at least one of a dielectric, silicon oxide (SiO), aluminum oxide (AlO), hafnium oxide (HfO), zirconium oxide (ZrO), yttrium oxide (YO), lanthanum oxide (LaO), or strontium oxide (SrO). In addition, the upper layer 140 may further include a dopant. In some example embodiments, the upper layer 140 may include, for example, at least one of Hf, Si, Al, Zr, Y, La, Gd, or Sr.

In some example embodiments, the upper layer 140 may include metal, a metal nitride, or a metal oxide. In some example embodiments, the upper layer 140 may include at least one of Si, germanium (Ge), a thin film semiconductor, an oxide semiconductor, a III-V-group compound, a 2D material, transition metal dichalcogenides, a quantum dot, a colloidal QD, a nanocrystal, or an organic material.

The ferroelectric layer 130 may be crystallized through an annealing process of at least part of an amorphous dielectric material (which may be implemented based on heat generated by a heat source being applied to the amorphous dielectric material), as will be described later. The ferroelectric layer 130 may have the effect of reducing a subthreshold swing (SS) of the electronic device 100 due to ferroelectric or anti-ferroelectric properties, thereby improving the functional performance thereof.

Ferroelectric materials have a spontaneous electric dipole, that is, spontaneous polarization, due to non-centrosymmetric charge distribution in a unit cell in a crystallized material structure. The ferroelectric materials have remnant polarization due to a dipole even in the absence of an external electric field. Furthermore, the direction of polarization may be changed on a domain basis by the external electric field.

Anti-ferroelectric materials may include an array of electric dipoles but remnant polarization of the anti-ferroelectric materials may be zero or close to zero. Because, in the absence of an electric field, the directions of adjacent dipoles are reversed and the polarization is canceled, the total spontaneous polarization and the remnant polarization may be zero or close to zero. However, in a state in which the external electric field is applied, polarization characteristics and switching characteristics may be exhibited.

Figure 5:
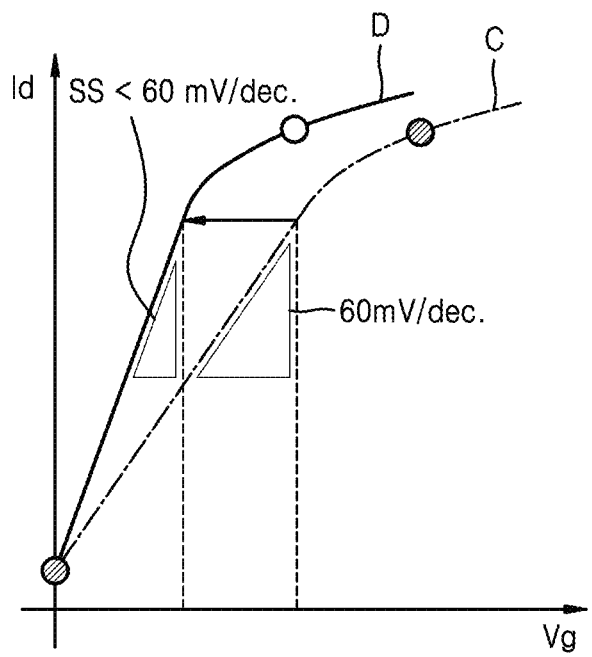
FIG. 5 is a graph showing the effect of enhancing sub-threshold swing (SS) characteristics of an electronic device according to some example embodiments.

FIG. 5 is a graph showing the effect of enhancing sub-threshold swing (SS) characteristics of an electronic device according to some example embodiments (e.g., the electronic device shown in FIG. 1), when the electronic device according to some example embodiments is applied to a logic transistor. The electronic device according to some example embodiments may include a seed layer and a ferroelectric layer. In FIG. 5, curve "C" shows an operating voltage Vg (e.g., in mV) and current Id (e.g., in A/μm 2) characteristics of a silicon-based logic transistor according to the related art, and curve "D" shows an operating voltage Vg and current Id characteristics of an electronic device according to some example embodiments (e.g., the electronic device shown in FIG. 1).

Referring to FIG. 5, it is known that, in the silicon-based transistor according to the related art, the subthreshold swing (SS) is limited to about 60 mV/dec (e.g., as shown in curve "C"). Contrary to this, in the electronic device according to some example embodiments (e.g., as shown in curve "D"), the subthreshold swing (SS) may be decreased to 60 mV/dec or less based on voltage amplification occurring when a domain of inside the ferroelectric is switched. Thus, the operating voltage of the electronic device according to some example embodiments may be decreased, and thus the operational performance and/or efficiency (e.g., improved power consumption efficiency and/or reduced power consumption) of the electronic device may be improved, for example based on including a ferroelectric layer as described herein.

Figure 6:
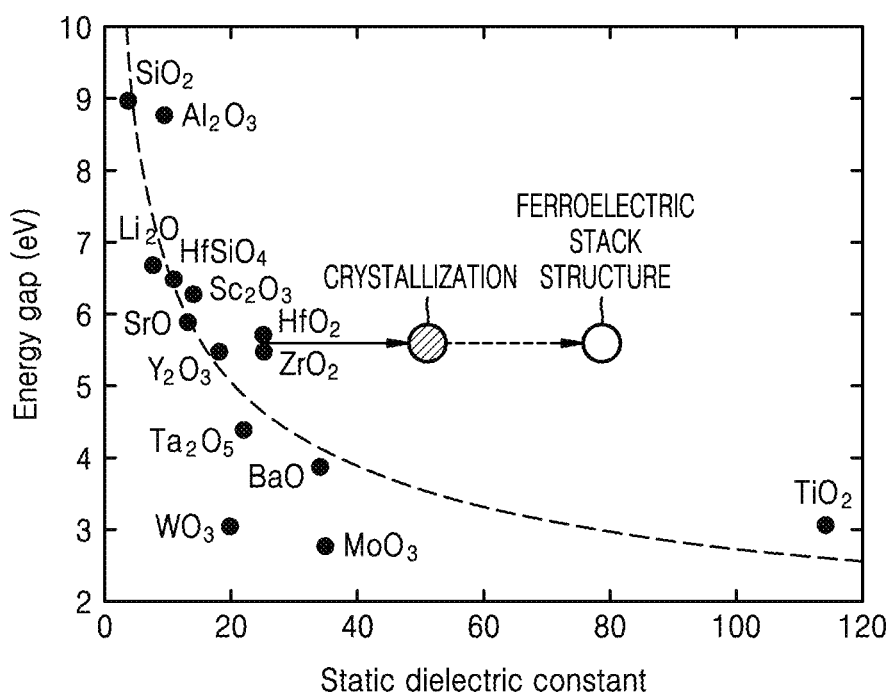
FIG. 6 illustrates a dielectric constant and a bandgap of a dielectric material.

FIG. 6 illustrates a static dielectric constant and an energy gap of a high-k dielectric material. Here, the high-k dielectric material may refer to a material having a higher dielectric constant than a silicon oxide. Referring to FIG. 6, the ferroelectric layer 130 may include a material having a high dielectric constant, for example, $ZrO_2$ or $HfO_2$. However, this is just an example, and the ferroelectric layer 130 may include other various high-k dielectric materials than the material. When the ferroelectric layer 130 is crystallized and when the ferroelectric layer 130 is stacked on the seed layer 120, a dielectric constant may be increased (e.g., to a dielectric constant that is greater than about 20), which may result in a decreased operating voltage of an electronic device that includes the ferroelectric layer 130 stacked on the seed layer 120, and thus the operational performance and/or efficiency (e.g., improved power consumption efficiency and/or reduced power consumption) of the electronic device may be improved.

A dopant may be further included in the ferroelectric layer 130. The dopant may include at least one of Si, Al, Zr, Y, La, Gd, Sr, or Hf, for example, but example embodiments of the present disclosure are not limited thereto. When a dopant is included in the ferroelectric layer 130, the dopant may be doped at the same concentration as a whole (e.g., the ferroelectric layer 130 may have a uniform concentration of the dopant throughout the ferroelectric layer 130), or may also be doped at different concentrations depending on regions. In addition, different dopants may be doped depending on regions of the ferroelectric layer 130 (e.g., the ferroelectric layer 130 may include different dopants in different regions of the ferroelectric layer 130).

Figure 7:
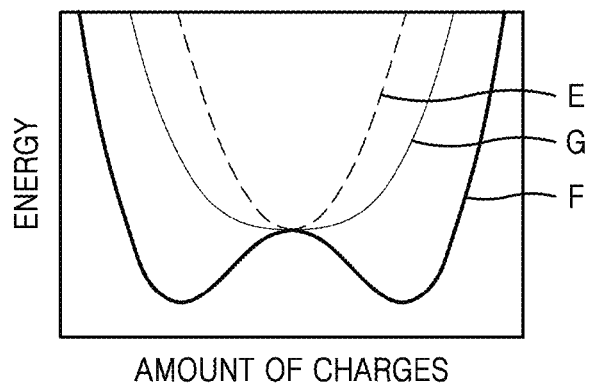
FIG. 7 illustrates energy changes according to the amount of charges of several materials.

FIG. 7 shows energy changes according to the amount of charges. Here, E is for an $SiO_2$ layer, F is for a ferroelectric, and G is for the sum of $SiO_2$ and the ferroelectric. Referring to FIG. 7, capacitance may be greater in a structure in which $SiO_2$ and ferroelectric layers are stacked, compared to the $SiO_2$ layer. However, in this case, the thickness of $SiO_2$ is large and is not suitable for a small electronic device. In some example embodiments, the seed layer may be used to reduce the thickness while increasing the capacitance.

In some example embodiments, based on using a seed layer having a lattice structure similar to that of the ferroelectric layer, the (111) crystal direction of the ferroelectric layer may be adjusted so that the capacitance may be increased and thus the operating voltage may be decreased, thereby improving the operational performance and/or efficiency (e.g., improved power consumption efficiency and/or reduced power consumption) of an electronic device that includes the ferroelectric layer (e.g., ferroelectric layer 130).

Figure 8:
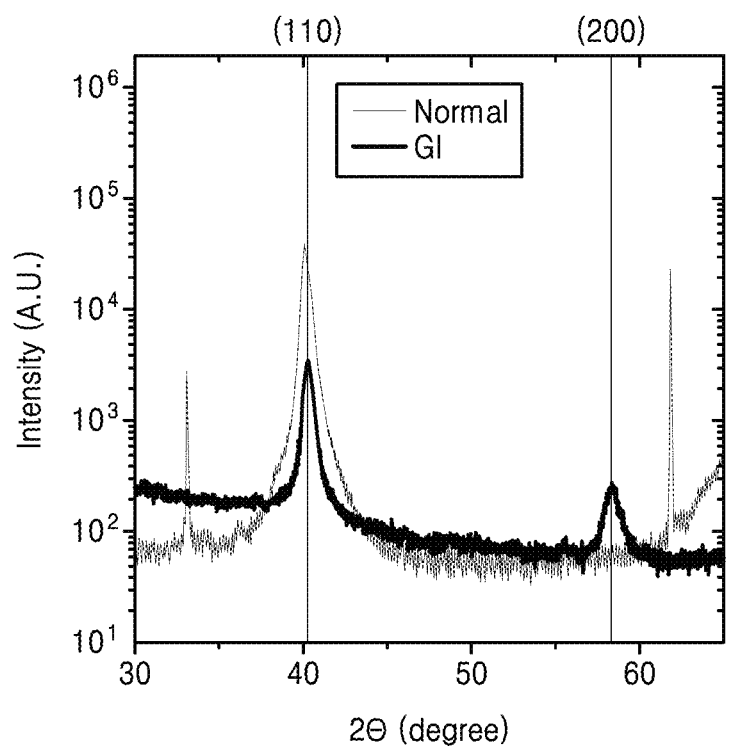
FIGS. 8 through 10 illustrate an x-ray diffraction (XRD) analysis result of a tungsten layer.
Figure 9:
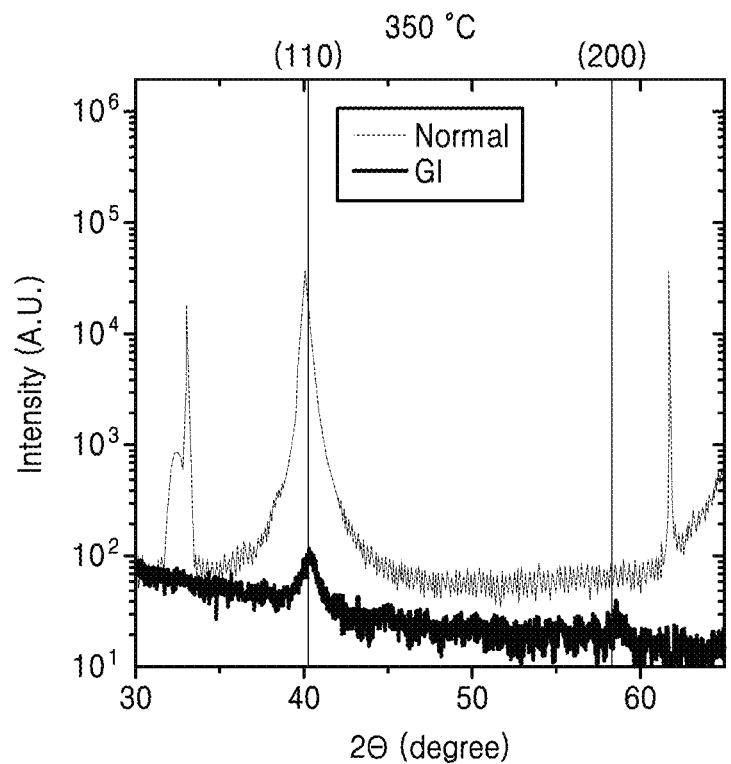
Figure 10:
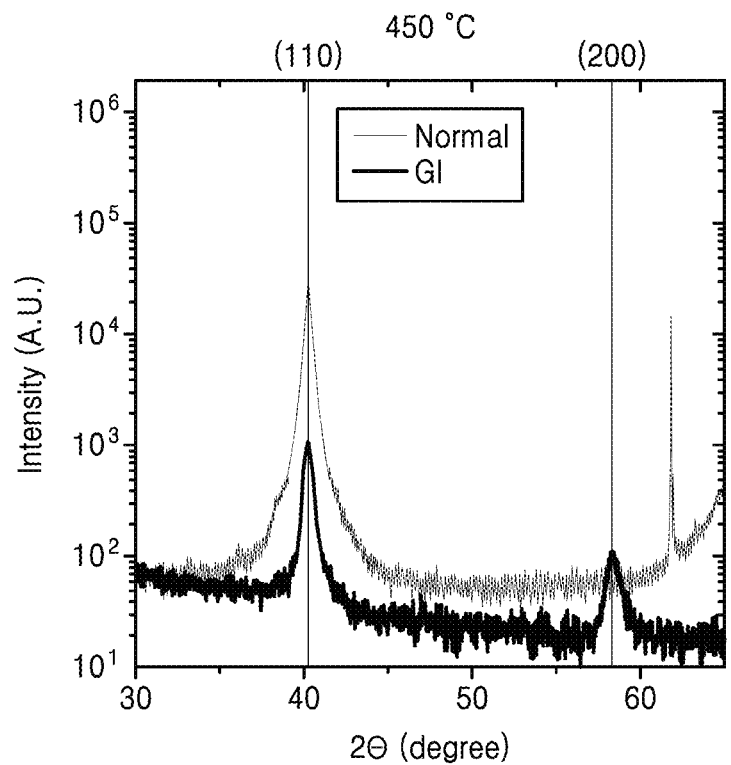

FIGS. 8, 9, and 10 show a structure for a metal layer so as to compare with a comparison example in which the seed layer of the electronic device according to some example embodiments includes a 2D material. FIG. 8 shows an x-ray diffraction (XRD) analysis result of a tungsten layer at the room temperature (e.g., between 20-30 degrees Celsius), for example. FIG. 8 shows a (110) crystal direction and a (200) crystal direction. FIG. 9 shows an XRD analysis result of a tungsten layer at 350 degrees Celsius, for example. FIG. 9 shows the (110) crystal direction. FIG. 10 shows an XRD analysis result of a tungsten layer at 450 degrees Celsius, for example. FIG. 10 shows the (110) crystal direction and the (200) crystal direction.

Referring to FIGS. 8 through 10, the metal layer such as tungsten does not represent the (111) crystal direction. Thus, when a ferroelectric layer is stacked on the metal layer (e.g., directly on the metal layer so as to be in direct contact with a surface of the metal layer), the (111) crystal direction of the ferroelectric layer may not be easily adjusted. Thus, when the ferroelectric layer is stacked on (e.g., directly on) the metal layer, it is difficult to expect the effect of decreasing the operating voltage.

Figure 11:
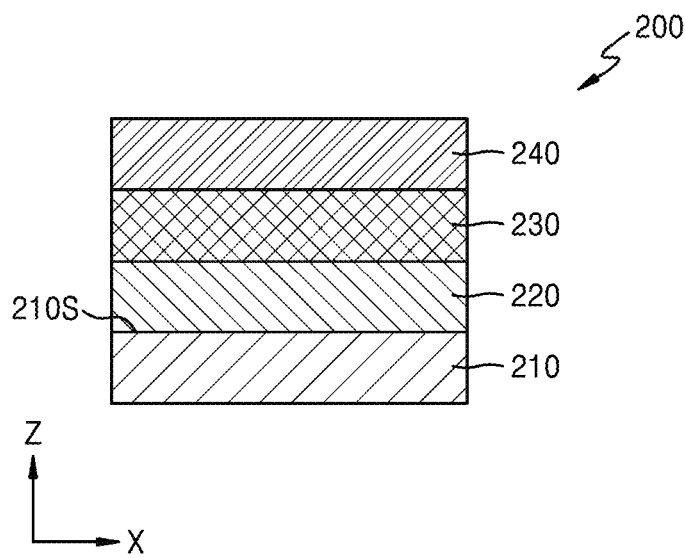
FIG. 11 schematically illustrates an electronic device according to some example embodiments.

FIG. 11 shows an electronic device according to some example embodiments.

An electronic device 200 may include a substrate 210, a seed layer 220 on the substrate 210 (e.g., directly on the substrate 210 as shown in FIG. 11), a ferroelectric layer 230 on the seed layer 220 (e.g., directly on the seed layer 220 as shown in FIG. 11), and an upper layer 240 on the ferroelectric layer 230 (e.g., directly on the ferroelectric layer 230 as shown in FIG. 11). The electronic device 200 may be applied to (e.g., included in) a capacitor element.

The substrate 210 may include a metal layer, for example. Here, the substrate 210 may be a metal layer, and a metal layer may also be between the substrate 210 and the seed layer 220. The upper layer 240 may include a metal layer, for example.

The seed layer 220 may include a 2D material and may have a lattice structure similar to that of the ferroelectric layer 230. The seed layer 220 and the ferroelectric layer 230 are substantially the same as the seed layer 120 and the ferroelectric layer 130 described with reference to FIG. 1 and thus, a detailed description thereof will be omitted.

The ferroelectric layer 230 may be arranged in a direction in which the (111) crystal direction is perpendicular to the top surface 210S of the substrate 210 due to the seed layer 220. When the ferroelectric layer 230 has this crystal structure and when the electronic device 200 is applied to (e.g., is included in) a capacitor, the capacitance of the capacitor may be increased, and thus, the operating voltage may be decreased and thus the operational performance and/or efficiency (e.g., improved power consumption efficiency and/or reduced power consumption) of the capacitor may be improved.

It will be understood that in some example embodiments, the adjacent layers 210-240 (e.g., layers 220 and 210, layers 230 and 220, and layers 240 and 230) may not be directly on each other, such that the layers are isolated from direct contact with each other by one or more interposing spaces and/or structures. For example, seed layer 220 may be indirectly on the substrate 210, the ferroelectric layer 230 may be indirectly on the seed layer 220 and between the upper layer 240 and the seed layer 220, and the upper layer 240 may be indirectly on the ferroelectric layer 230.

Figure 12:
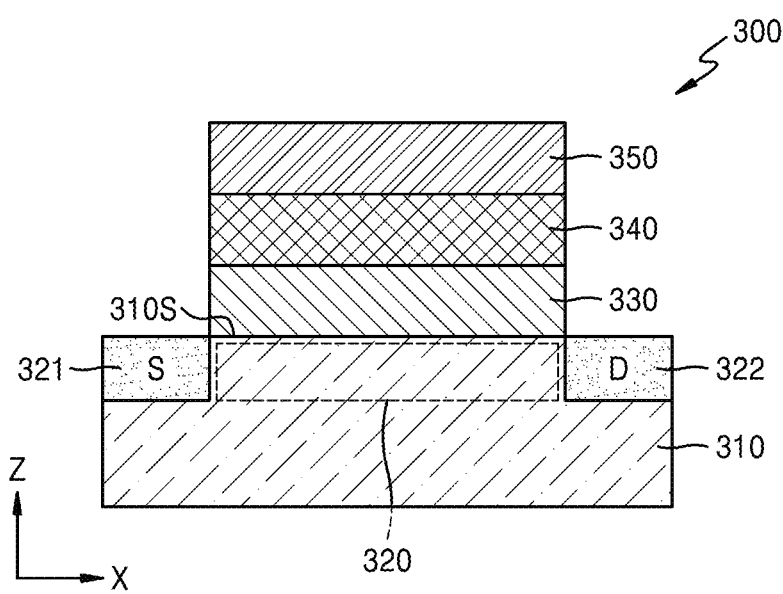
FIG. 12 schematically illustrates an electronic device according to some example embodiments.

FIG. 12 schematically illustrates an electronic device according to some example embodiments.

An electronic device 300 may include a substrate 310, a seed layer 330 on the substrate 310 (e.g., directly on the substrate 310 as shown in FIG. 12), a ferroelectric layer 340 on the seed layer 330 (e.g., directly on the seed layer 330 as shown in FIG. 12), and an upper layer 350 on the ferroelectric layer 340 (e.g., directly on the ferroelectric layer 340 as shown in FIG. 12). A source electrode 321 and a drain electrode 322 may be provided at both sides (e.g., opposite sides) of the substrate 310. The electronic device 300 may be applied to (e.g., included in) a transistor. The upper layer 350 may be a gate electrode layer, for example. The upper layer 350 may include a conductive material.

In the electronic device 300 according to some example embodiments, the source electrode 321 may be provided at one side of the substrate 310, and the drain electrode 322 may be provided at the other side of the substrate 310. The source electrode 321 and the drain electrode 322 may be formed by injecting impurities into different regions of the substrate 310, and a region 320 of the substrate 310 between the source electrode 321 and the drain electrode 322 may be defined as a channel element (e.g., a channel layer). However, sin some example embodiments an electronic device 300 may include a channel layer (not shown) that may also be provided independently of the substrate 310 (e.g., may be a separate piece of material in relation to the substrate 310).

The substrate 310 may be a Si substrate, for example, and may include other semiconductor materials, for example, Ge, SiGe, a III-V-group semiconductor, etc., than Si. However, a material for forming the substrate 310 is not limited to the above description and may be variously changed.

It will be understood that in some example embodiments, the adjacent layers 310-350 (e.g., layers 330 and 310, layers 340 and 330, and layers 350 and 340) may not be directly on each other, such that the layers are isolated from direct contact with each other by one or more interposing spaces and/or structures. For example, seed layer 330 may be indirectly on the substrate 310, the ferroelectric layer 340 may be indirectly on the seed layer 330 and between the upper layer 350 and the seed layer 330, and the upper layer 350 may be indirectly on the ferroelectric layer 340.

An electronic device described in some example embodiments that is a semiconductor-based device may have a gate stack structure including a ferroelectric layer having a higher dielectric constant than that of silicon oxide and a gate electrode. The electronic device may be applied to (e.g., included in) a logic device or memory device, for example.

Hereinafter, a method of manufacturing an electronic device, according to some example embodiments will be described.

FIGS. 13, 14, 15, and 16 illustrate a method of manufacturing an electronic device, according to some example embodiments.

Figure 13:
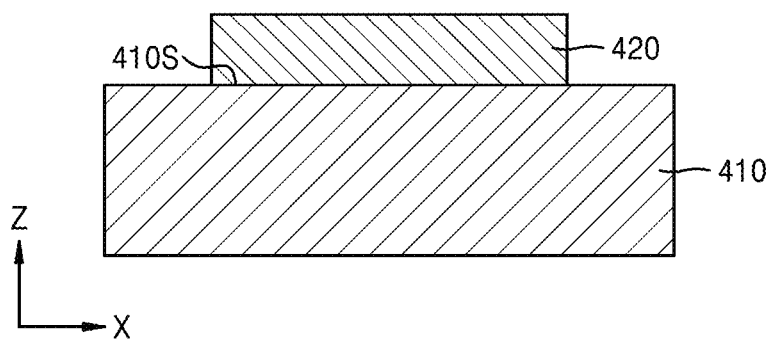
FIGS. 13, 14, 15, and 16 illustrate a method of manufacturing an electronic device, according to some example embodiments.

Referring to FIG. 13, a seed layer 420 may be stacked on a substrate 410 (e.g., directly on the substrate 410 such that the seed layer 420 is in direct contact with the top surface 410S of the substrate 410), but it will be understood than the seed layer 420 may be stacked to be indirectly on the substrate 410 and isolated from direct contact with the top surface 410S thereof. The substrate 410 may include, for example, Si, Ge, SiGe, a III-V-group compound semiconductor, or a 2D material. The seed layer 420 may include, for example, a 2D material. The seed layer 420 may include, for example, at least one of 1T-$MoTe_2$, 1T-$WTe_2$, 2H—$MoTe_2$, 2H—$WTe_2$, 1T-$ZrS_2$, 1T-$HfS_2$, 2H—$ZrS_2$, 2H—$HfS_2$, 2H—$CrTe_2$, 2H—$HfSe_2$, 1T-$PdS_2$, 1T-$PtS_2$, 2H—$SnS_2$, 2H—$TiSe_2$, 2H—$VTe_2$, 2H—$NbSe_2$, or GaS.

Figure 14:
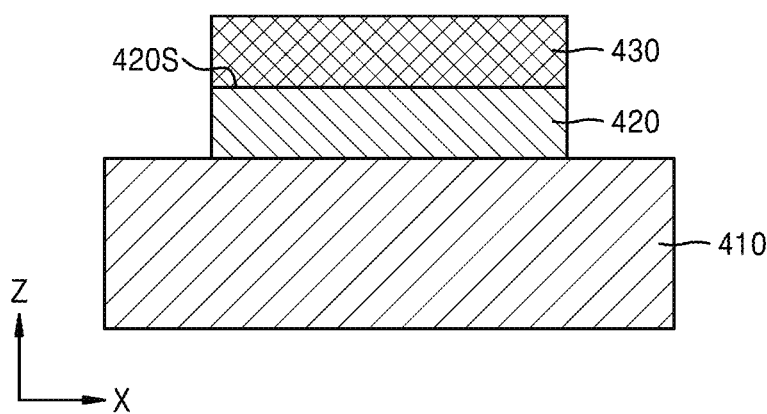

Referring to FIG. 14, a ferroelectric layer 430 may be deposited on the seed layer 420 (e.g., directly on the seed layer 420 such that the ferroelectric layer 430 is in direct contact with the top surface 420S of the seed layer 420), but it will be understood that the ferroelectric layer 430 may be stacked to be indirectly on the seed layer 420 and isolated from direct contact with the top surface 420S thereof. A deposition method may include deposition layer deposition (ALD) or chemical vapor deposition (CVD). The ferroelectric layer 430 may be in an amorphous state (e.g., an amorphous material layer). When the seed layer 420 includes a 2D material and the ferroelectric layer 430 is deposited on the seed layer 420, the ferroelectric layer 430 may be aligned within the range of ±30 degrees with respect to a direction in which the (111) crystal direction of the ferroelectric layer 430 is perpendicular to the substrate 410 (e.g., ±30 degrees with respect to the Z-direction). The ferroelectric layer 430 may be aligned within the range of ±20 degrees with respect to a direction in which the (111) crystal direction of the ferroelectric layer 430 is perpendicular to the substrate 410 (e.g., ±20 degrees with respect to the Z-direction). According to some example embodiments, the (111) crystal direction may be aligned even before the ferroelectric layer 430 is crystallized.

Moreover, when the ferroelectric layer 430 is deposited on the seed layer 420, the ferroelectric layer 430 may also be crystallized by using pulsed laser deposition.

Figure 15:
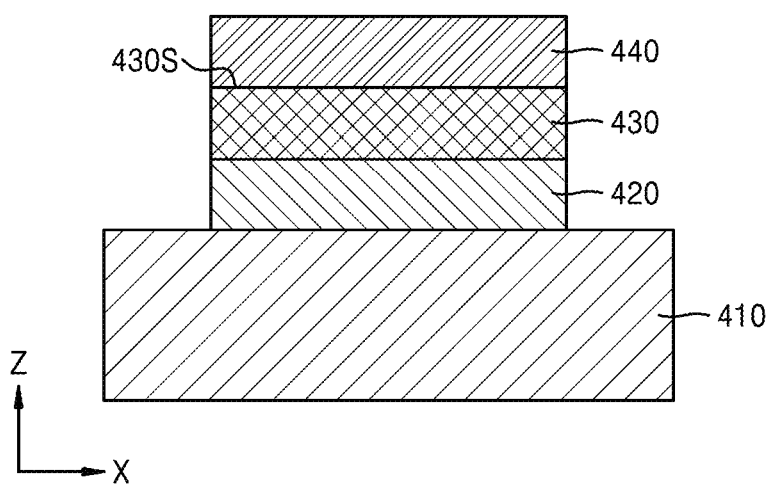

Referring to FIG. 15, an upper layer 440 may be deposited on the ferroelectric layer 430 (e.g., directly on the ferroelectric layer 430 such that the upper layer 440 is in direct contact with the top surface 430S of the ferroelectric layer 430), but it will be understood that the upper layer 440 may be stacked to be indirectly on the ferroelectric layer 430 and isolated from direct contact with the top surface 430S thereof. The upper layer 440 may include a metal layer, a protective layer, or an electrode layer, for example. The upper layer 440 may be deposited by using ALD, CVD, or physical vapor deposition (PVD).

Figure 16:
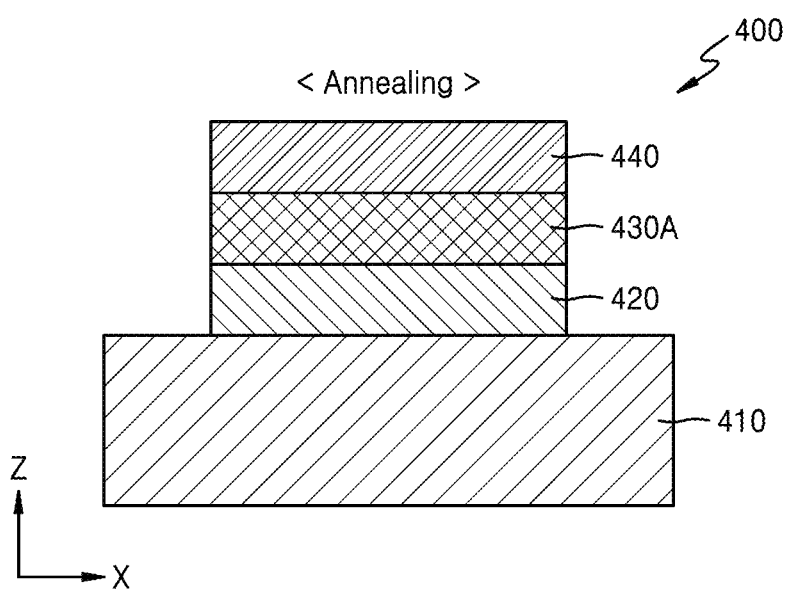

Referring to FIG. 16, a ferroelectric layer 430A may be crystallized through an annealing process, for example based on annealing a structure shown in FIG. 15, to form an electronic device 400 as shown in FIG. 16. Such annealing may be implemented based on a heat source generating heat that is applied to at least the ferroelectric layer 430 to implement annealing of at least the amorphous material of the ferroelectric layer 430 to thus cause the crystallizing. Restated, the ferroelectric layer 430 may be crystallized to form the ferroelectric layer 430A through an annealing process.

The ferroelectric layer 430A may be crystallized so that a polarization value of the ferroelectric layer 430A may be increased. In addition, in a structure in which the crystal direction of the ferroelectric layer 430A is aligned, a threshold shift or memory window may be greater than a structure in which the crystal direction is random. In addition, when the crystal direction of the ferroelectric layer 430A is aligned in a logic application device, uniformity may be enhanced compared to a case where the crystal direction is random, and thus operational performance and/or efficiency (e.g., improved power consumption efficiency and/or reduced power consumption) of a logic application device that includes at least the ferroelectric layer 430A may be improved. In some example embodiments, the annealing may be performed on the structure shown in FIG. 14, prior to forming the upper layer 440 as shown in FIG. 15, so that the ferroelectric layer 430 is annealed to form the ferroelectric layer 430A through crystallization of the material of the ferroelectric layer 430. The upper layer 440 may be subsequently formed on the ferroelectric layer 430A, or a structure that includes the ferroelectric layer 430A may omit the upper layer 440 such that the upper layer 440 is not formed on the ferroelectric layer 430A.

Moreover, the method of manufacturing an electronic device according to some example embodiments may further include removing the substrate 410 from the seed layer 420 (e.g., detaching a structure that includes at least the ferroelectric layer 430, 430A, etc.) from the substrate 410). After the substrate 410 is removed, the other structure may be transferred onto another structure layer.

The electronic device according to some example embodiments may decrease the operating voltage while reducing the size by using a seed layer including a 2D material, and therefore the operational performance of the electronic device may be improved.

In the method of manufacturing an electronic device according to some example embodiments, a ferroelectric layer may be crystallized by using the seed layer including a 2D material.

It will be understood that the electronic devices 100, 200, and 300 may be formed (e.g., manufactured) via a method that is similar to the method shown in FIGS. 13-16. For example, with regard to the electronic device 300 shown in FIG. 12, a method for manufacturing the electronic device 300 may include providing a substrate 310 that is as described above with reference to FIG. 12. In addition, the method for manufacturing the electronic device 300 may include forming a seed layer 330 on the channel layer region 320 of the substrate 310 via a method similar or the same as the process for forming the seed layer 420 as described above with reference to FIG. 13. The seed layer 330 may be formed directly on the channel layer region 320 (e.g., directly on the portion of the top surface 310S of the substrate 310 that defines a top surface of the channel layer region 320). In addition, the method for manufacturing the electronic device 300 may include forming a ferroelectric layer 340 on the seed layer 330 via a method similar or the same as the process for forming the ferroelectric layer 430 and/or ferroelectric layer 430A as described above with reference to FIGS. 14-16. In addition, the method for manufacturing the electronic device 300 may include forming an upper layer 350 on the ferroelectric layer 340 via a method similar or the same as the process for forming the upper layer 440 as described above with reference to FIGS. 15-16.

Figure 17:
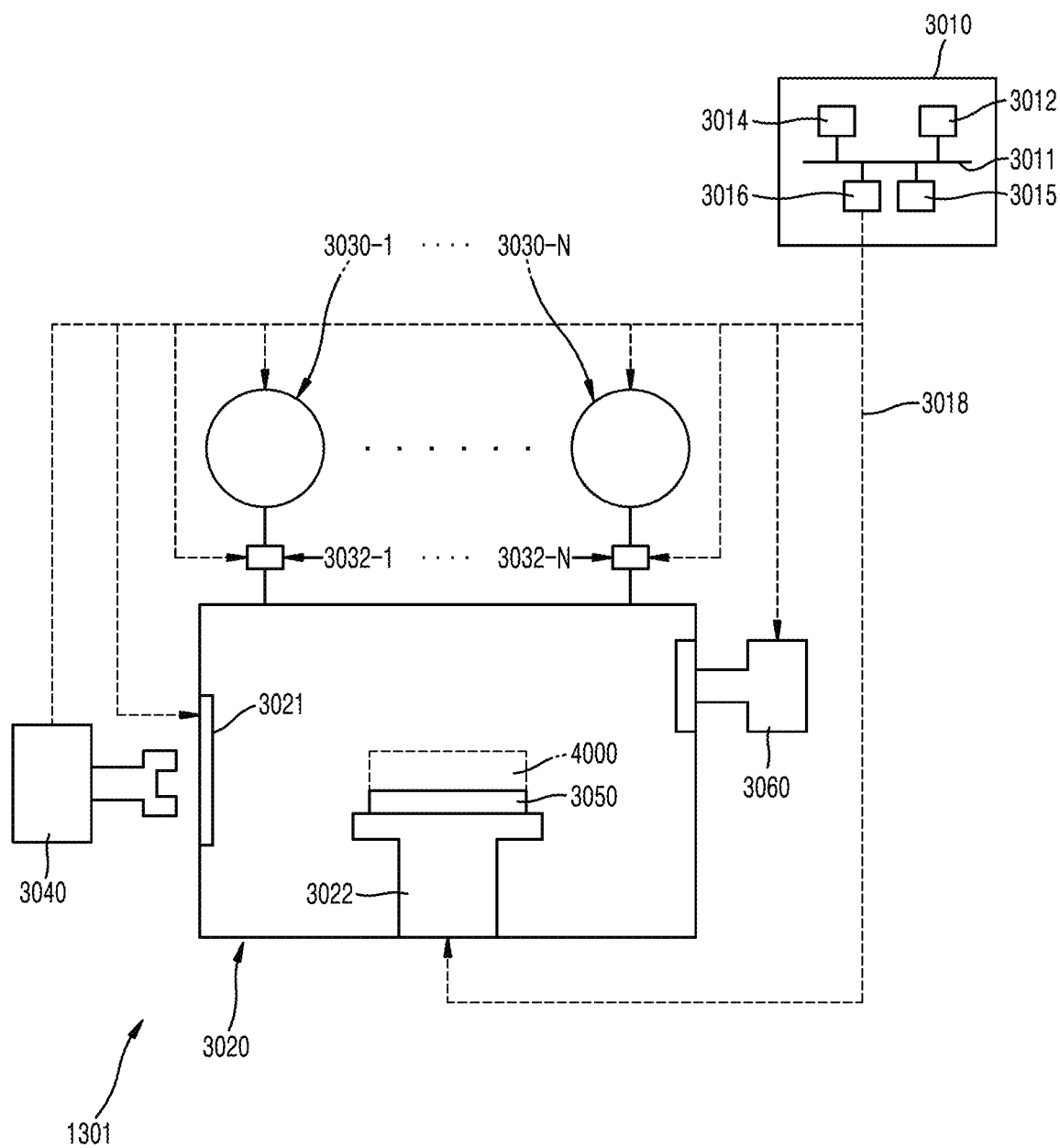
FIG. 17 shows a schematic of a system configured to control the manufacturing of an electronic device according to some example embodiments.

FIG. 17 shows a schematic of a system 1301 configured to control the formation (also referred to herein interchangeably as "fabrication" or "manufacturing") of an electronic device according to some example embodiments. As used herein, a system 1301 may be referred to as a "set."

Referring to FIG. 17, system 1301 includes a computing device 3010 (also referred to herein interchangeably as an electronic device), a manipulator device 3040, composition (e.g., gas, fluid, etc.) sources 3030-1 to 3030-N (where N is a positive integer), a heat source 3060, and a process chamber 3020.

Referring first to the computing device 3010, the computing device 3010 may include processing circuitry 3012 (also referred to herein as simply a processor), memory 3014, a power supply 3015, and a communication interface 3016 that are communicatively and/or electrically coupled together via a bus 3011.

The computing device 3010 may be included in one or more various electronic devices, including, for example, a mobile phone, a digital camera, a sensor device, or the like. In some example embodiments, the computing device 3010 may include one or more of a server, a mobile device, a personal computer (PC), a tablet computer, a laptop computer, a netbook, some combination thereof, or the like. A mobile device may include a mobile phone, a smartphone, a personal digital assistant (PDA), some combination thereof, or the like. The computing device 3010 may be referred to herein as simply "processing circuitry."

The memory 3014, the processing circuitry 3012, the power supply 3015, and the communication interface 3016 may communicate with one another through the bus 3011.

The communication interface 3016 may communicate data to and/or from an external device using various communication protocols. In some example embodiments, the communication interface may be connected to an electronic line (e.g., wire) and may be configured to receive and process electrical signals from one or more external devices.

The processing circuitry 3012 may execute a program and control one or more aspects of the system 1301, via the communication interface 3016 as shown in FIG. 17. A program code to be executed by the processing circuitry 3012 may be stored in the memory 3014.

The memory 3014 may store information. The memory 3014 may be a volatile or a nonvolatile memory. The memory 3014 may be a non-transitory computer readable storage medium. The memory may store computer-readable instructions that, when executed, cause the execution of one or more methods, functions, processes, etc. as described herein. In some example embodiments, the processing circuitry 3012 may execute one or more of the computer-readable instructions stored at the memory 3014 to cause the system 1301 to perform some of all of the methods described herein, including the method illustrated in FIGS. 13-16 and/or FIG. 20, and/or any method for forming (e.g., "fabricating," "manufacturing," etc.) any electronic devices according to any of the example embodiments.

In some example embodiments, the communication interface 3016 may include a USB and/or HDMI interface. In some example embodiments, the communication interface 3016 may include a wireless communication interface.

Still referring to FIG. 17, the process chamber 3020 may be any of the process chambers described herein and may include a pedestal and/or chuck 3022 that is configured to structurally support a substrate 3050 upon which an electronic device 4000 (which may be any of the example embodiments of electronic devices according to any of the example embodiments described herein) according to any of the example embodiments may be formed (e.g., "fabricated," "manufactured," etc.). In some example embodiments, the substrate 3050 may be at least a portion of a substrate, first electrode, or the like that is at least partially included in the electronic device 4000 according to any example embodiments (e.g., substrate 110, substrate 210, substrate 310, substrate 410, or the like). As shown, the pedestal and/or chuck 3022 may be coupled to a motor such that the electronic device 3010 (e.g., "processing circuitry") may be configured to cause the pedestal and/or chuck 3022 to move, via control signals communicated from communication interface 3016, for example to enable the substrate 3050 and/or electronic device 4000 to be moved within, into, and/or out of the process chamber 3020.

Still referring to FIG. 17, system 1301 includes a manipulator device 3040, which may be any device for manipulating thin-film structures and/or substrates into and/or out of a process chamber 3020, and the process chamber 3020 may include a portal 3021 (e.g., door) via which the manipulator device 3040 may access the interior of the process chamber 3020 to provide a substrate 3050 and/or to retrieve at least an electronic device 4000 formed therein. As shown, the manipulator device 3040 and the portal 3021 may be controlled by the electronic device 3010 (e.g., "processing circuitry").

Still referring to FIG. 17, the system 1301 includes one or more composition sources 3030-1 to 3030-N(N being a positive integer) which may store various materials, including any materials, dopants, and/or compositions described herein, or any combination thereof, as described herein. The materials may be stored as a gas, as a liquid, as a solid, as any type of fluid, or any combination thereof. As shown, each separate composition source is coupled to the process chamber 3020 via a separate supply control device 3032-1 to 3032-N (e.g., control valve), where each control device 3032-1 to 3032-N is configured (e.g., based on being a control valve) to control a supply of a separate material held in a separate (e.g., corresponding) coupled composition source 3030-1 to 3030-N to the process chamber. The composition sources 3030-1 to 3030-N and/or control devices 3032-1 to 3032-N may be controlled by electronic device 3010 (e.g., "processing circuitry").

Still referring to FIG. 17, system 1301 includes a heat source 3060, which may be a heating device, heating element, heater, or the like that may be utilized to generate heat and provide the generated heat to the process chamber 3020 (e.g., to heat at least a portion of the process chamber 3020), for example implement annealing of a structure that includes a ferroelectric layer as described herein. As shown, the heat source 3060 may be controlled by the electronic device 3010 (e.g., "processing circuitry").

As shown in FIG. 17, the electronic device 3010 (e.g., "processing circuitry") may, for example based on processing circuitry 3012 executing a program of instruction stored on memory 3014, communicate with various elements of the system 1301 via communication lines 3018 to cause the system 1301 to form an electronic device 4000 according to any example embodiments herein (e.g., form any of the electronic devices 100, 200, 300, 400 as described herein with regard to any example embodiments, including any of the methods described herein with reference to FIGS. 13-16). It will be understood that the system 1301 may omit one or more of the elements shown in FIG. 17 (e.g., the heat source 3060, the pedestal or chuck 3022, or the like).

Figure 18:
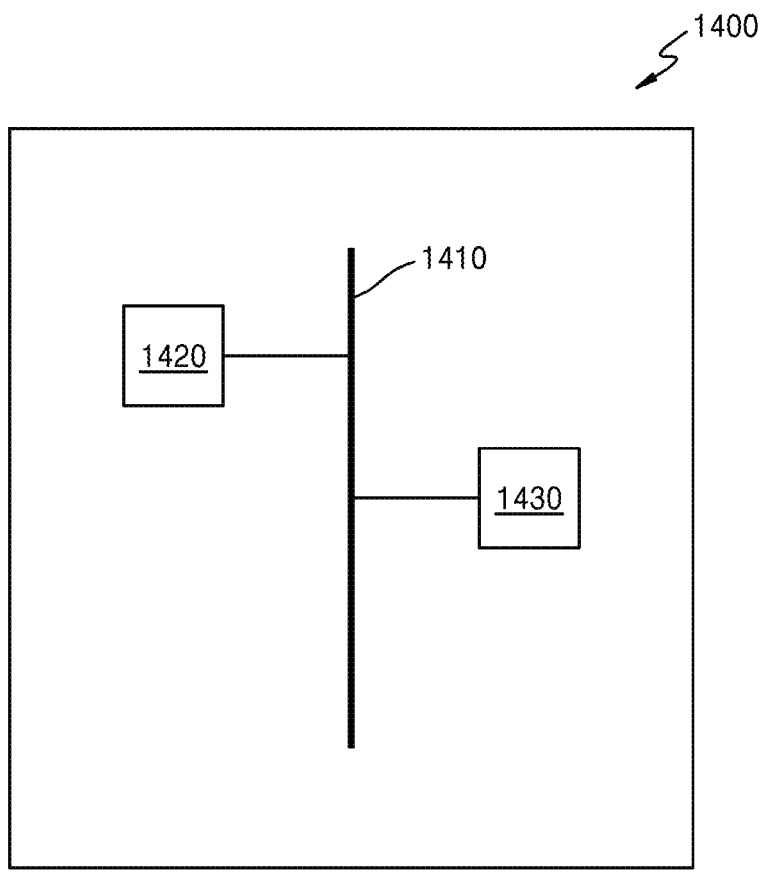
FIG. 18 shows a schematic of an electronic device that may include the electronic device according to some example embodiments.

FIG. 18 shows a schematic of an electronic device according to some example embodiments.

As shown, the electronic device 1400 includes one or more electronic device components, including a processor (e.g., processing circuitry) 1420 and a memory 1430 that are communicatively coupled together via a bus 1410. The electronic device 1400 may be referred to herein as a "computing device."

The processing circuitry 1420, may be included in, may include, and/or may be implemented by one or more instances of processing circuitry such as hardware including logic circuits, a hardware/software combination such as a processor executing software; or a combination thereof. For example, the processing circuitry 1420 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 1430 may include a non-transitory computer readable storage device, for example a solid state drive (SSD), storing a program of instructions, and the processing circuitry 1420 may be configured to execute the program of instructions to implement the functionality of the electronic device 1400.

In some example embodiments, the electronic device 1400 (e.g., "computing device") may include an electronic device (e.g., logic transistor) according to any of the example embodiments in one or more of the processing circuitry 1420 or the memory 1430, where said electronic device includes at least a seed layer including a two-dimensional (2D) material, and a ferroelectric layer on the seed layer, where the ferroelectric layer is configured to be aligned within a range of ±30 degrees with respect to a direction in which a (111) crystal direction is perpendicular to a top surface of a substrate on which the seed layer is located and/or a top surface of the seed layer. The electronic device 1400 (e.g., "computing device") may exhibit improved operational performance as a result, e.g., based on one or more portions of the electronic device 1400 (e.g., the processing circuitry 1420 and/or memory 1430) having improved characteristics.

Figure 19:
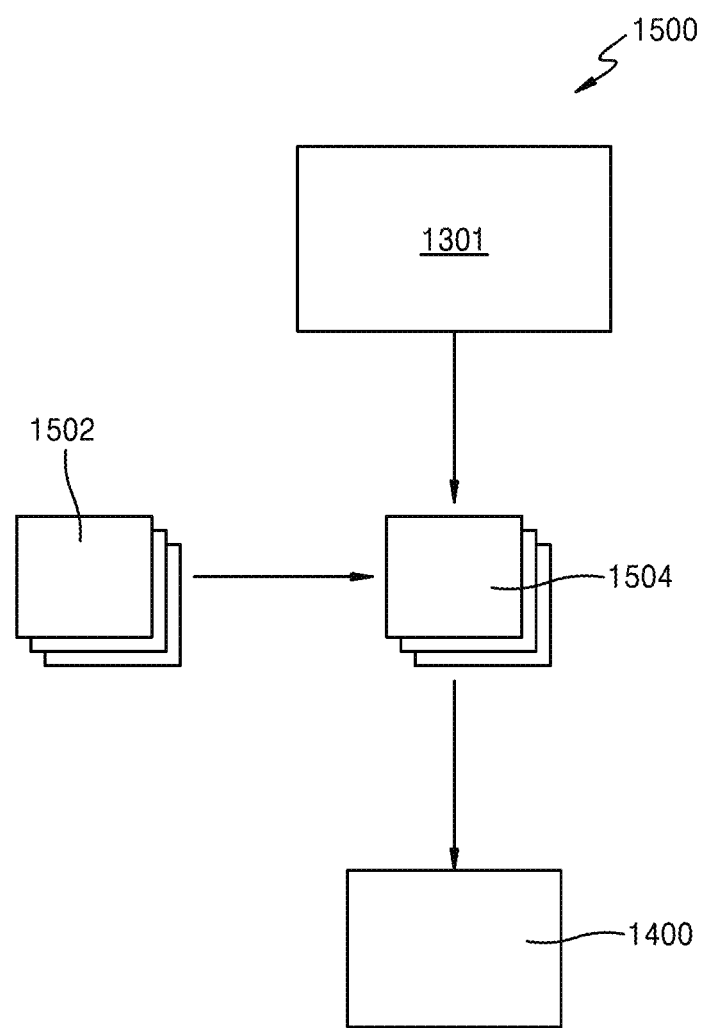
FIG. 19 shows a schematic of a system configured to control the manufacturing of an electronic device according to some example embodiments.
Figure 20:
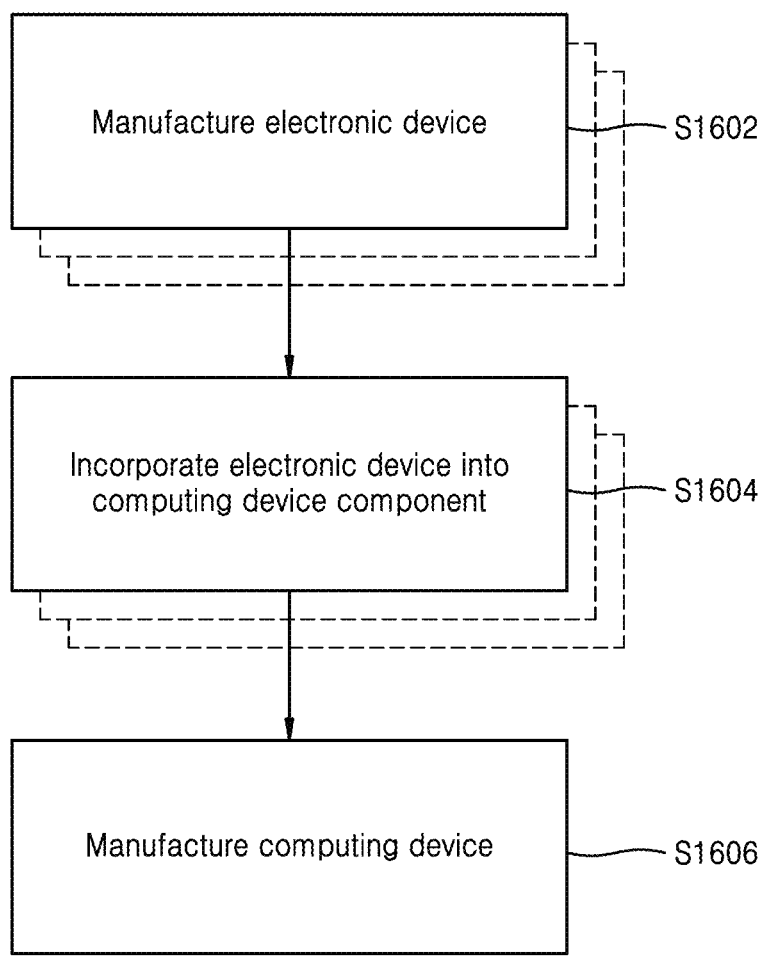
FIG. 20 is a flowchart illustrating a method implemented by the system illustrated in FIG. 19 to manufacture an electronic device according to some example embodiments.

FIG. 19 shows a schematic of a system 1500 configured to control the formation of an electronic device (e.g., "computing device") according to some example embodiments, and FIG. 20 is a flowchart illustrating a method implemented by the system 1500 to manufacture an electronic device (e.g., "computing device") according to some example embodiments. As shown, the system 1500 may include system 1301, which is configured to form one or more electronic devices 4000 according to any of the example embodiments of the inventive concepts (S1602), including forming one or more electronic device 4000 that include electronic device 400 according to the method shown in FIGS. 13-16. In some example embodiments, where the one or more electronic devices formed at S1602 are configured to be incorporated into a separate electronic device (e.g., "computing device", such as electronic device 1400), the one or more electronic devices formed at S1602 may be referred to as "sub-devices." For example, an electronic device 4000 formed based on system 1301 implementing a method for forming an electronic device (e.g., the method as shown in FIGS. 13-16) may be a device that is configured to be incorporated into an electronic device that is a computing device (e.g., electronic device 1400 as shown in FIG. 18). The system 1500 further includes a fabrication assembly 1504 that is configured to incorporate the electronic device(s) formed by system 1301 (e.g., electronic device 400) with various electronic device (e.g., "computing device") sub-components 1502 (where the sub-components 1502 may include printed circuit boards, power supplies, buses, communication interface components, processing circuitry components, memory components, any combination thereof, or the like). The fabrication assembly 1504 may incorporate the electronic device(s) 4000 that are sub-device(s) with the sub-components 1502 (S1604), to fabricate ("manufacture") electronic device (e.g., "computing device") components (e.g., processing circuitries 1420, memories 1430, any combination thereof, or the like) and/or electronic devices (e.g., "computing device") themselves, to manufacture ("fabricate") separate electronic device(s) 1400 (e.g., "computing devices") that include one or more electronic devices (e.g., electronic devices 100, 200, 300, and/or 400) according to any example embodiments of the inventive concepts (S1606). Such incorporation (S1604) and manufacturing (S1606) may include, for example, assembling an electronic device (e.g., "computing device") component (e.g., processing circuitry 1420 and/or memory 1430 based on incorporating said electronic devices to additional electronic device sub-components, etc.) based on coupling the electronic device(s) 4000 to one or more electronic device sub-components and coupling the electronic device component to other electronic device components (e.g., printed circuit board, or PCB) to manufacture the electronic device (e.g., 1400).

It should be understood that some example embodiments described herein should be considered in a descriptive sense only and not for purposes of limitation. Descriptions of features or aspects within each example embodiment should typically be considered as available for other similar features or aspects in some example embodiments. While some example embodiments have been described with reference to the figures, it will be understood by those of ordinary skill in the art that various changes in form and details may be made therein without departing from the spirit and scope as defined by the following claims.

What is claimed is:

1. An electronic device, comprising:
    a substrate;
    a seed layer on the substrate, the seed layer including a two-dimensional (2D) material; and
    a ferroelectric layer on the seed layer,
    wherein the seed layer has a lattice constant having a magnitude that is in a range of about 90% to about 110% with respect to a magnitude of a lattice constant of the ferroelectric layer.

2. The electronic device of claim 1, wherein the seed layer includes a metallic 2D material.

3. The electronic device of claim 1, wherein the seed layer includes at least one of 1T-$MoTe_2$, 1T-$WTe_2$, 2H—$MoTe_2$, 2H—$WTe_2$, 1T-$ZrS_2$, 1T-$HfS_2$, 2H—$ZrS_2$, 2H—$HfS_2$, 2H—$CrTe_2$, 2H—$HfSe_2$, 1T-$PdS_2$, 1T-$PtS_2$, 2H—$SnS_2$, 2H—$TiSe_2$, 2H—$VTe_2$, 2H-$NbSe_2$, or GaS.

4. The electronic device of claim 1, wherein the seed layer has a thickness in a range of about 0.3 nm to about 100 nm.

5. The electronic device of claim 1, wherein the ferroelectric layer includes an oxide of at least one of silicon (Si), aluminum (Al), hafnium (Hf), or zirconium (Zr).

6. The electronic device of claim 5, wherein the ferroelectric layer includes a dopant, the dopant including at least one of hafnium (Hf), silicon (Si), aluminum (Al), zirconium (Zr), yttrium (Y), lanthanum (La), gadolinium (Gd), or strontium (Sr).

7. The electronic device of claim 1, wherein the ferroelectric layer has ferroelectric or anti-ferroelectric properties.

8. The electronic device of claim 1, wherein the seed layer has a hexagonal lattice structure.

9. The electronic device of claim 1, further comprising:
    an upper layer on the ferroelectric layer, the upper layer including at least one of a dielectric, silicon oxide (SiO), aluminum oxide (AlO), hafnium oxide (HfO), zirconium oxide (ZrO), yttrium oxide (YO), lanthanum oxide (LaO), or strontium oxide (SrO).

10. The electronic device of claim 9, wherein the upper layer includes at least one of Hf, Si, Al, Zr, Y, La, Gd, or Sr.

11. The electronic device of claim 9, wherein the upper layer includes a metal, a metal nitride, or a metal oxide.

12. The electronic device of claim 9, wherein the upper layer includes at least one of Si, germanium (Ge), a thin film semiconductor, an oxide semiconductor, a III-V-group compound, a 2D material, transition metal dichalcogenides, a quantum dot, a colloidal QD, a nanocrystal, or an organic material.

13. The electronic device of claim 1, wherein the lattice constant of the seed layer is in a range of about 2.16 to about 3.96.

14. The electronic device of claim 1, wherein the seed layer has an energy band gap greater than or equal to about 0.2 and less than or equal to about 1.8.

15. A method of manufacturing an electronic device, the method comprising:
    forming a seed layer on a substrate, wherein the seed layer includes a two-dimensional (2D) material; and
    forming a ferroelectric layer on the seed layer,
    wherein the seed layer has a lattice constant having a magnitude that is in a range of about 90% to about 110% with respect to a magnitude of a lattice constant of the ferroelectric layer.

16. The method of claim 15, further comprising crystallizing the ferroelectric layer through an annealing process.

17. The method of claim 15, wherein the magnitude of the lattice constant of the seed layer is in a range of about 90% to about 110% with respect to the magnitude of the lattice constant of the ferroelectric layer.

18. The method of claim 15, wherein the seed layer includes at least one of 1T-$MoTe_2$, 1T-$WTe_2$, 2H—$MoTe_2$, 2H—$WTe_2$, 1T-$ZrS_2$, 1T-$HfS_2$, 2H—$ZrS_2$, 2H—$HfS_2$, 2H—$CrTe_2$, 2H—$HfSe_2$, 1T-$PdS_2$, 1T-$PtS_2$, 2H—$SnS_2$, 2H—$TiSe_2$, 2H—$VTe_2$, 2H-$NbSe_2$, or GaS.

19. The method of claim 15, wherein the ferroelectric layer includes an oxide of at least one of silicon (Si), aluminum (Al), hafnium (Hf), or zirconium (Zr).

* * * * *